(12) United States Patent
Hsu et al.

(10) Patent No.: US 8,748,323 B2
(45) Date of Patent: Jun. 10, 2014

(54) PATTERNING METHOD

(75) Inventors: Han-Hui Hsu, Hsinchu (TW);
Shih-Ping Hong, Hsinchu (TW);
An-Chi Wei, Hsinchu (TW);
Ming-Tsung Wu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 974 days.

(21) Appl. No.: 12/217,645

(22) Filed: Jul. 7, 2008

(65) Prior Publication Data

US 2010/0000969 A1    Jan. 7, 2010

(51) Int. Cl.
*H01L 21/768* (2006.01)
*H01L 21/3105* (2006.01)
*H01L 21/314* (2006.01)

(52) U.S. Cl.
USPC ........... 438/738; 438/717; 438/720; 438/706; 438/710

(58) Field of Classification Search
CPC .......... H01L 21/76811; H01L 21/76805; H01L 21/31056; H01L 21/4757; H01L 21/76808
USPC .............. 216/47; 438/717, 738, 720
See application file for complete search history.

(56) References Cited

U.S. PATENT DOCUMENTS

| | | | | |
|---|---|---|---|---|
| 5,858,621 A * | 1/1999 | Yu et al. | | 430/313 |
| 5,883,011 A * | 3/1999 | Lin et al. | | 438/747 |
| 6,127,262 A * | 10/2000 | Huang et al. | | 438/634 |
| 6,861,347 B2 | 3/2005 | Lee et al. | | |
| 7,001,843 B2 | 2/2006 | Park | | |
| 7,300,883 B2 * | 11/2007 | Celii et al. | | 438/736 |
| 2005/0176243 A1 * | 8/2005 | Han et al. | | 438/640 |
| 2006/0240639 A1 * | 10/2006 | Akiyama | | 438/445 |
| 2007/0006451 A1 | 1/2007 | Lee et al. | | |
| 2007/0293050 A1 * | 12/2007 | Kang et al. | | 438/696 |
| 2007/0298604 A1 * | 12/2007 | Liu et al. | | 438/624 |
| 2008/0001295 A1 * | 1/2008 | Alba et al. | | 257/760 |
| 2008/0145998 A1 * | 6/2008 | Delgadino et al. | | 438/401 |
| 2009/0194503 A1 * | 8/2009 | Ko et al. | | 216/47 |
| 2009/0256186 A1 * | 10/2009 | Kang et al. | | 257/314 |

FOREIGN PATENT DOCUMENTS

| | | |
|---|---|---|
| CN | 1350321 | 5/2002 |
| TW | 372335 | 10/1999 |
| TW | 457583 | 10/2001 |
| TW | 594871 | 6/2004 |
| TW | I293406 | 2/2008 |

OTHER PUBLICATIONS

"Office Action of Taiwan counterpart application" issued on Apr. 9, 2013, p. 1-p. 5.

* cited by examiner

*Primary Examiner* — Binh X Tran
*Assistant Examiner* — Thomas Pham
(74) *Attorney, Agent, or Firm* — J.C. Patents

(57) ABSTRACT

A patterning method is provided. First, a substrate having an objective material layer thereon is provided. Thereafter, a mask layer is formed on the objective material layer. Afterwards, a patterned layer is formed over the mask layer, wherein a material of the patterned layer includes a metal-containing substance. Then, the mask layer is patterned to form a patterned mask layer. Further, the objective material layer is patterned, using the patterned mask layer as a mask.

16 Claims, 6 Drawing Sheets

PATTERNING METHOD

BACKGROUND OF THE INVENTION

1. Field of Invention

The present invention relates to a semiconductor fabrication method, and more particularly to a patterning method.

2. Description of Related Art

The demand for a higher resolution in a photolithography process goes up as dimensions of semiconductor devices continue to shrink. Generally, the resolution increases as the thickness of a photoresist layer decreases. The photoresist layer, however, must have a thickness sufficient to resist etching (i.e. anti-etching ability). Hence, the miniaturization of devices can hardly be achieved by reducing the thickness of the photoresist layer directly.

Further, the incident light, which is through the photoresist layer and reflected from the substrate, interferes with a portion thereof, so as to cause a non-uniform exposure to the photoresist layer and result in a variation of critical dimensions. For example, the incident light and the reflected light combine in the photoresist layer to create standing waves and cause distortions in the patterns of the photoresist layer; thus, the undesired change of a line width, such as necking or bridging and even photoresist collapse occurs.

Due to the above-mentioned problems, it is rather difficult when fabricating a metal line with a line width less than 80 nm. Therefore, the technology of enhancing the resolution without losing any anti-etching ability, and avoiding the reflection effect in the lithography process has been diligently pursued in the semiconductor industry.

SUMMARY OF THE INVENTION

The present invention provides a patterning method which can enhance the resolution without losing any anti-etching ability, and avoid the reflection effect in the lithography process, so as to fabricate a metal line with a line width less than 80 nm.

The present invention provides a patterning method. First, a substrate having an objective material layer thereon is provided. Thereafter, a mask layer is formed on the objective material layer. Afterwards, a patterned layer is formed over the mask layer, wherein a material of the patterned layer concludes a metal-containing substance. Then, the mask is patterned to form a patterned mask layer. Further, the objective material layer is patterned, using the patterned mask layer as a mask.

According to an embodiment of the present invention, the metal containing substance is selected from the group consisting of Ti, TiN, Ti/TiN, Ta, TaN, Ta/TaN, W, WN and W/WN.

According to an embodiment of the present invention; an etch selectivity of the mask layer to the patterned layer is greater than about 3.

According to an embodiment of the present invention, an etch selectivity of the mask layer to the patterned layer is greater than about 10.

According to an embodiment of the present invention, an etch selectivity of the mask layer to the patterned layer is greater than about 15.

According to an embodiment of the present invention, the method of forming the patterned layer includes the following steps. First, a stop layer is formed on the mask layer. Thereafter, a patterned photoresist layer is formed on the stop layer. Afterwards, the stop layer is etched, using the photoresist layer as a mask, to form the patterned layer. The patterned photoresist layer is then removed.

According to an embodiment of the present invention, the step of forming the patterned layer further includes performing a trimming process to the patterned photoresist layer so as to reduce a line width before the step of etching the stop layer.

According to an embodiment of the present invention, a material of the objective material layer comprises metal, polysilicon, polyside or metal salicide.

According to an embodiment of the present invention, a material of the mask layer includes TEOS-SiO$_2$, BPSG, PSG, HSQ, FSG, USG, SiN or SiON.

According to an embodiment of the present invention, a thickness of the stop layer is between about 200 and 400 angstroms.

According to an embodiment of the present invention, a thickness of the mask layer is between about 1000 and 4000 angstroms.

The present invention also provides a patterning method. First, a stacking structure is provided on a substrate. The stacking structure includes an objective material layer, a dielectric material layer and at least a metal-containing substance layer subsequently formed on the substrate. Thereafter, the metal-containing substance layer is patterned to form the patterned layer. Afterwards, the dielectric material layer is etched by using the patterned layer as a mask to form a patterned dielectric layer. Then, the objective material layer is etched by using the patterned dielectric layer as a mask.

According to an embodiment of the present invention, a material of the metal-containing substance layer is selected from the group consisting of Ti, TiN, Ti/TiN, Ta, TaN, Ta/TaN, W, WN and W/WN.

According to an embodiment of the present invention, the method of forming the patterned layer includes the following steps. First, a patterned photoresist layer is formed on the stop layer. Thereafter, the metal-containing substance layer is etched, using the photoresist layer as a mask, to form the patterned layer. Afterwards, the patterned photoresist layer is removed.

According to an embodiment of the present invention, the step of forming the patterned layer further includes performing a trimming process to the patterned photoresist layer so as to reduce a line width before the step of etching the metal-containing substance layer.

According to an embodiment of the present invention, a material of the objective material layer includes Cu, AlCu or AlSiCu.

The present invention further provides a patterning method. First, a substrate having a conductive layer thereon is provided. Thereafter, a mask layer is formed on the conductive layer. Afterwards, a patterned layer is formed over the mask layer. Then, an etching recipe is performed to pattern the mask layer, wherein an etch selectivity of the mask layer to the patterned layer is greater than 3. Further, the conductive layer is patterned, using the patterned mask layer as a mask.

According to an embodiment of the present invention, the method of forming the patterned layer includes the following steps. First, a stop layer is formed on the mask layer. Thereafter, a patterned photoresist layer is formed on the stop layer. Afterwards, the stop layer is etched, using the photoresist layer as a mask, to form the patterned layer. The patterned photoresist layer is then removed.

According to an embodiment of the present invention, the step of forming the patterned layer further includes performing a trimming process to the patterned photoresist layer so as to reduce a line width before the step of etching the stop layer.

According to an embodiment of the present invention, a material of the mask layer includes TEOS-SiO$_2$, BPSG, PSG, HSQ, FSG, USG, SiN or SiON.

According to the patterning method of the present invention, a stop layer is disposed between the mask layer and the patterned photoresist layer to increase the resolution in a photolithography process as well as the anti-etching ability in an etching process. Therefore, the patterning method is beneficial for fabricating a line width less than 80 nm, and even for reducing critical dimensions of semiconductor devices.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1C' to 1D' schematically illustrate a cross-section view of a patterning method according to another embodiment of the present invention.

DESCRIPTION OF EMBODIMENTS

FIGS. 1A to 1D schematically illustrate a cross-section view of a patterning method according to an embodiment of the present invention.

Figure 1A:
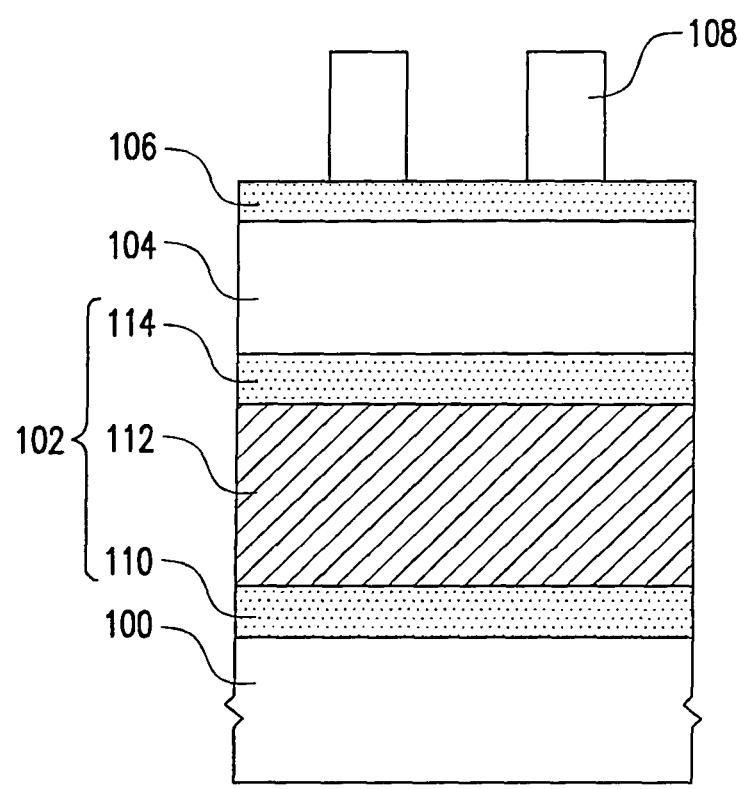
FIGS. 1A to 1D schematically illustrate a cross-section view of a patterning method according to an embodiment of the present invention.

Referring to FIG. 1A, a substrate 100 is provided. The substrate 100 may be a semiconductor substrate, such as a silicon substrate. The substrate 100 has an objective material layer 102 thereon. The objective material layer 102 may be a conductive layer including metal, polysilicon, polycide or metal salicide, for example.

A mask layer 104 is then formed on the objective material layer 102. The mask layer 104 may be a dielectric material layer or an insulation layer, and the material thereof includes tetraethyl orthosilicate SiO$_2$ (TEOS-SiO$_2$), borophosphosilicate glass (BPSG), phosphosilicate glass (PSG), hydrogen silsesquioxane (HSQ), fluorosilicate glass (FSG), undoped silicate glass (USG), silicon nitride (SiN) or silicon oxynitride (SiON), for example. The method of forming the insulation layer includes spin coating or chemical vapor deposition (CVD), for example. The thickness of the mask layer is between about 1000 and 4000 angstroms, for example. In an embodiment, the thickness of the mask layer 104 is about 1800 angstroms.

Thereafter, at least one stop layer 106 is formed on the mask layer 104. The objective material layer 102, the mask layer 104 and the stop layer 106 form a stacking structure. The stop layer 106 may include a metal-containing substance. In details, the material of the stop layer 106 includes refractory metal, refractory metal nitride or combinations thereof. For example, the material of the stop layer 106 is selected from the group consisting of Ti, TiN, Ti/TiN, Ta, TaN, Ta/TaN, W, WN and W/WN. The Ti/TiN layer is a composite layer including Ti and TiN. Similarly, the Ta/TaN layer is a composite layer including Ta and TaN, and The W/WN layer is a composite layer including W and WN. The thickness of the stop layer 106 is between about 200 and 400 angstroms, for example. In an embodiment, the thickness of the stop layer 106 is about 400 angstroms.

Afterwards, a patterned photoresist layer 108 is formed on the stop layer 106. The method of forming the patterned photoresist layer 108 includes forming a photoresist layer (not shown) on the stop layer 106, and then performing an exposure-and-development process to form the patterned photoresist layer 108. In an embodiment (not shown), a trimming process can be performed to the patterned photoresist layer 108 to further reduce the line width. The thickness of the patterned photoresist layer 108 is between about 200 and 4000 angstroms, for example. In an embodiment, the thickness of the patterned photoresist layer 108 is about 1200 angstroms.

Figure 1B:
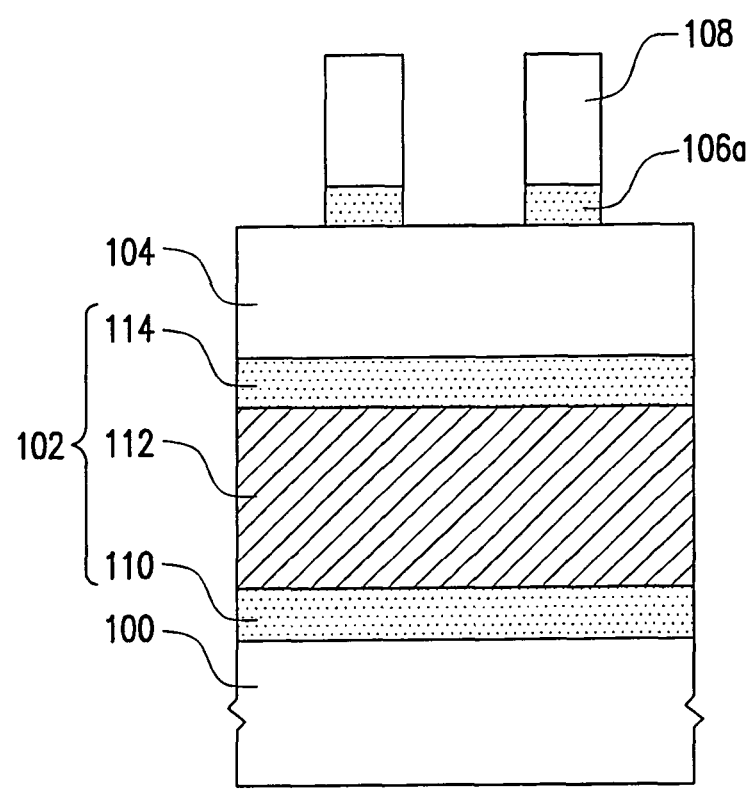

Referring to FIG. 1B, the stop layer 106 is etched, using the patterned photoresist layer 108 as a mask, to form a patterned layer 106a. The patterned photoresist layer 108 is then removed.

Figure 1C:
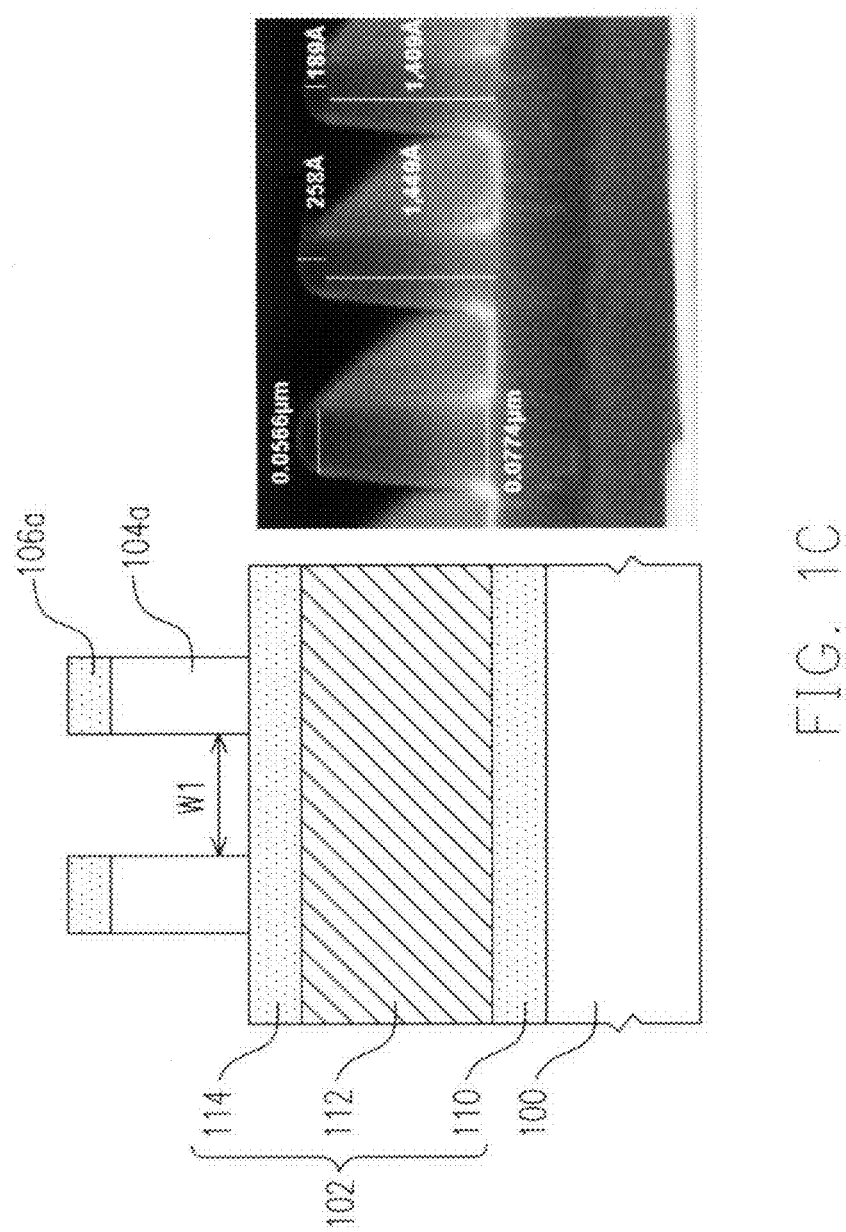
Figure 1C:
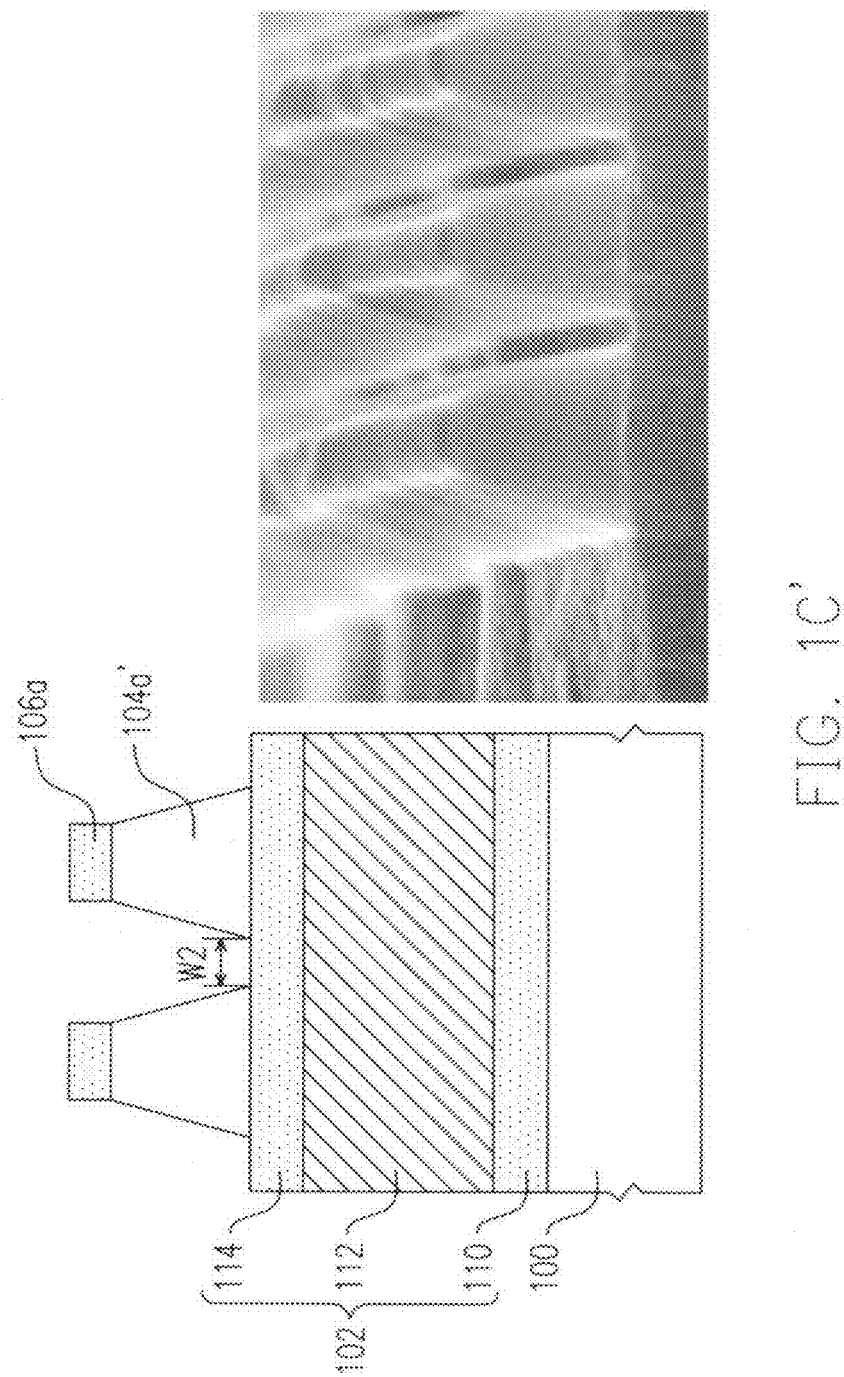

Referring to FIG. 1C, the mask layer 104 is etched, using the patterned layer 106a as a mask, to form a patterned mask layer 104a.

Figure 1D:
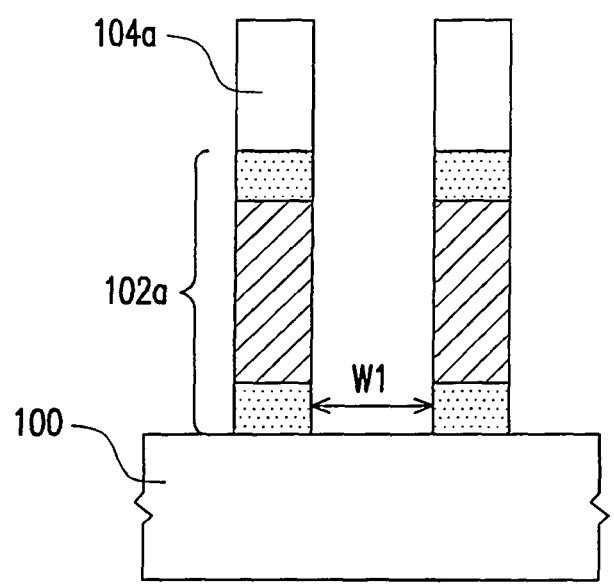
Figure 1D:
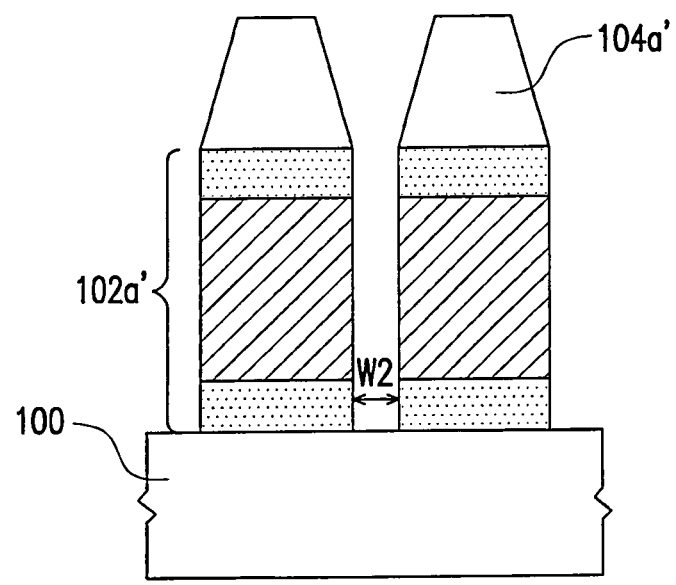

Referring to FIG. 1D, the objective material layer 102 is etched, using the patterned layer 106a and the patterned mask layer 104a as a mask, to form a patterned objective material layer 102a. In an embodiment, the patterned layer 106a is also removed simultaneously during the step of etching the objective material layer 102, as shown in FIG. 1D. In another embodiment (not shown), the patterned layer 106a and the patterned mask layer 104a are not removed during the step of etching the objective material layer 102. A patterning process is thus finished.

Note that in the patterning method of the present invention, a stop layer is disposed between the mask layer and the patterned photoresist layer to increase the resolution in a photolithography process as well as the anti-etching ability in an etching process. In other words, the stop layer 106 has a high etch selectivity with respect to the patterned photoresist layer 108 thereon, so that the thickness of the patterned photoresist layer 108 can be reduced; that is, not only can photoresist collapse be avoided, but also the resolution can be enhanced without losing any anti-etching ability. Further, the stop layer 106 also has a high etch selectivity with respect to the mask layer 104 thereunder, so that the patterning process of the mask layer 104 can be easily achieved with the thin stop layer 106.

Several embodiments are enumerated hereinafter for illustrating applications in accordance with the present invention.

First Embodiment

The present invention can be applied to the process of fabricating a line width less than 80 um, such as a metal line of 65 nm or 45 nm.

In this embodiment, a structure of FIG. 1A is formed first, wherein the objective material layer 102 may be a sandwich structure including a barrier layer 110, a metal layer 112 and an anti-reflection layer 114 which are sequentially formed on the substrate 100. The barrier layer 110, the anti-reflection layer 114 and the stop layer 106 may include the same material such as refractory metal, refractory metal nitride or combinations thereof. For example, the barrier layer 110 and the anti-reflection layer 114 include a material selected from the group consisting of Ti, TiN, Ti/TiN, Ta, TaN, Ta/TaN, W, WN and W/WN. The material of the metal layer 112 includes Cu, AlCu or AlSiCu, for example. The method of forming the barrier layer 110, the metal layer 112 and the anti-reflection layer 114 includes sputtering or CVD, for example. The material of the mask layer 104 is selected from the group consisting of TEOS-SiO$_2$, BPSG, PSG, HSQ, FSG and USG. The materials and methods of the stop layer 106 and patterned photoresist layer 108 are similar to the above-mentioned embodiments.

A trimming process is then performed to the patterned photoresist layer 108. The parameters of the trimming process include a pressure of about 12~18 mT (milli Torr), a top plate power of about 640~960 W, a bottom plate power of about zero W, a Cl$_2$ flow rate of about 64~96 sccm, a CHF$_3$ flow rate of about 8~12 sccm and a time of about 12~18 seconds. The line width of the patterned photoresist layer 108 is reduced from 80 nm to 55~60 nm, and the thickness thereof is reduced from 1200 to 900~1000 angstroms.

Referring to FIG. 1B, the stop layer 106 is etched, using the patterned photoresist layer 108 as a mask, to form a patterned layer 106a. The etching process includes a break through etching step and an over etching step. In an embodiment, the stop layer 106 is a Ti/TiN layer with a thickness of 300 angstroms, for example. The parameters of the break through etching step include a pressure of about 8~12 mT, a top plate power of about 400~600 W, a bottom plate power of about 32~48 W, a Cl$_2$ flow rate of about 64~96 sccm, a CHF$_3$ flow rate of about 8~12 sccm and a time of about 16~24 seconds. The parameters of the over etching step include a pressure of about 8~12 mT, a top plate power of about 400~600 W, a bottom plate power of about 32~48 W, a Cl$_2$ flow rate of about 64~96 sccm, a CHF$_3$ flow rate of about 8~12 sccm and a time of about 10~14 seconds. In this embodiment, the etch selectivity of the patterned photoresist layer 108 to the stop layer 106 is about 0.5 (etch selectivity=patterned photoresist layer/stop layer), which is good enough so that the thickness of the patterned photoresist layer 108 can be reduced; that is, the resolution can be enhanced without losing any anti-etching ability, and the photoresist collapse caused by the reflection effect can be avoided by applying the stop layer 106 under the patterned photoresist layer 108 in the photolithography process.

Referring to FIG. 1C, the mask layer 104 is etched, using the patterned layer 106a as a mask, to form a patterned mask layer 104a. The etching process includes a main etching step and an over etching step. In an embodiment, the mask layer 104 is a silicon oxide layer with a thickness of 1400 angstroms, for example. The parameters of the main etching step include a pressure of about 120~180 mT, a power of about 120~180 W, a CF$_4$ flow rate of about 48~72 sccm, a N$_2$ flow rate of about 16~24 sccm, an Ar flow rate of about 120~180 sccm and a time of about 120~180 seconds. The parameters of the over etching step include a pressure of about 120~180 mT, a power of about 120~180 W, a CHF$_3$ flow rate of about 32~48 sccm, a CF$_4$ flow rate of about 16~24 sccm, a N$_2$ flow rate of about 16~24 sccm, an Ar flow rate of about 120~180 sccm and a time of about 24~36 seconds. The etch selectivity of the mask layer 104 to the patterned layer 106a (etch selectivity=mask layer/patterned layer) is greater than about 10. In this embodiment, the etch selectivity of the mask layer 104 to the patterned layer 106a is about 13, which is high enough so that the patterning process of the mask layer 104 can be easily achieved with the thin stop layer 106. In another embodiment, the etch selectivity of the mask layer 104 to the patterned layer 106a can be greater than about 15.

Referring to FIG. 1D, the objective material layer 102 is etched, using the patterned layer 106a and the patterned mask layer 104a as a mask, to form a patterned objective material layer 102a. The etching process includes a break through etching step for etching the anti-reflection layer 114, a main etching step for etching the metal layer 112 and an over etching step for etching the barrier layer 110. In an embodiment, the anti-reflection layer 114 is a Ti/TiN layer with a thickness of 700 angstroms, the metal layer 112 is an AlCu layer with a thickness of 1500 angstroms and the barrier layer 110 is a Ti/TiN layer with a thickness of 40 angstroms, for example. The parameters of the break through etching step include a pressure of about 10~14 mT, a top plate power of about 400~600 W, a bottom plate power of about 32~48 W, a Cl$_2$ flow rate of about 32~48 sccm, a BCl$_3$ flow rate of about 8~12 sccm, a CHF$_3$ flow rate of about 4~6 sccm, a N$_2$ flow rate of about 8~12 sccm and a time of about 14~22 seconds. The parameters of the main etching step include a pressure of about 8~12 mT, a top plate power of about 400~600 W, a bottom plate power of about 72~108 W, a Cl$_2$ flow rate of about 56~84 sccm, a BCl$_3$ flow rate of about 40~60 sccm, a CHF$_3$ flow rate of about 4~8 sccm, a N$_2$ flow rate of about 4~8 sccm and a time of about 12~20 seconds. The parameters of the over etching step include a pressure of about 8~12 mT, a top plate power of about 320~480 W, a bottom plate power of about 120~180 W, a Cl$_2$ flow rate of about 24~36 sccm, a BCl$_3$ flow rate of about 40~60 sccm, a CHF$_3$ flow rate of about 12~18 sccm, a N$_2$ flow rate of about 8~10 sccm and a time of about 16~24 seconds.

In the present invention, the patterning process of the objective material layer 102 is preformed, using a double-layer structure including a patterned layer 106a and a patterned mask layer 104a as an etching mask, so that the profile of the patterned objective material layer 102a is sharper than the conventional profile when using a single layer (i.e. mask layer) as an etching mask. On the other side, the anti-reflection layer 114 and the stop layer 106 include the same material, such as Ti/TiN, so that the patterned layer 106a can also be removed simultaneously during the step of forming the patterned objective material layer 102a.

The patterning method in accordance with the present invention can be applied to the back-end metallization process with a line width less than 80 nm. It is for sure that the present invention can also be applied to the front-end process if the process is controlled appropriately without any metal contamination between the front-end and the back-end. That is, the material of the objective material layer 102 may include polysilicon, polycide, metal silicide or the like.

Second Embodiment

Like the first embodiment, the second embodiment is for fabricating a space less than 80 nm, especially for reducing a gap width by applying the patterning method of the present invention. FIGS. 1C' to 1D' schematically illustrate a cross-section view of a patterning method according to another embodiment of the present invention.

In this embodiment, a structure of FIG. 1B is formed first, wherein the materials and methods of forming the objective material layer 102 (including the barrier layer 110, the metal layer 112 and the anti-reflection layer 114), the patterned layer 106a and the patterned photoresist layer 108 are similar to the above-mentioned embodiments. It is noted that the material of the mask layer 104 of the second embodiment is different from that of the first embodiment. For example, the material of the mask layer 104 includes SiN or SiON.

Referring to FIG. 1C', the mask layer 104 is etched, using the patterned layer 106a as a mask, to form a patterned mask layer 104a'. In an embodiment, the parameters of the main etching step include a pressure of about 120~150 mT, a power of about 480~720 W, a CF$_4$ flow rate of about 48~72 sccm, a N$_2$ flow rate of about 16~24 sccm, an Ar flow rate of about 120~180 sccm and a time of about 28~42 seconds. The parameters of the over etching step include a pressure of about 120~180 mT, a power of about 120~180 W, a $CHF_3$ flow rate of about 32~48 sccm, a $CF_4$ flow rate of about 16~24 sccm, a $N_2$ flow rate of about 16~24 sccm, an Ar flow rate of about 120~180 sccm and a time of about 24~36 seconds. The etch selectivity of the mask layer 104 to the patterned layer 106a (etch selectivity=mask layer/patterned layer) is greater than about 3. In this embodiment, the etch selectivity of the mask layer 104 to the patterned layer 106a is about 5. The etch selectivity of the second embodiment (~5) is lower than the etch selectivity (~13) of the first embodiment, so that more metallic polymers are produced in the second embodiment; thus the profile of the patterned mask layer 104a' is shaped as a trapezoid, which is different from the rectangular profile of the patterned mask layer 104a in FIG. 1C. That is, due to the difference in etch selectivity between the first and the second embodiments, the gap width W2 of the patterned mask layer 104a' (as shown in FIG. 1C') is smaller than the gap width W1 of the patterned mask layer 104a (as shown in FIG. 1C).

Referring to FIG. 1D', the objective material layer 102 is etched, using the patterned layer 106a and the patterned mask layer 104a' as a mask, to form a patterned objective material layer 102a'. In this embodiment, due to the trapezoid profile of the patterned mask layer 104a', the gap width W2 of the patterned objective material layer 102a' (as shown in FIG. 1D') is smaller than the gap width W1 of the patterned objective material layer 102a (as shown in FIG. 1D), so that the purpose of reducing a gap width is achieved.

In summary, not only the process of fabricating a line width less than 80 nm, but also the process of reducing a gap can be achieved by using the patterning method of the present invention without replacing any existing fabricating equipment. Therefore, the cost is greatly reduced and the competitiveness is significantly improved.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A patterning method, comprising:
   providing a substrate with an upper surface, the substrate has an objective material layer thereon, wherein the objective material layer is a multi-layer structure comprising a barrier layer, a metal layer and an anti-reflection layer sequentially formed on the substrate;
   forming a mask layer with a lower surface on the objective material layer;
   forming a material layer comprising a metal-containing substance on the mask layer, wherein a thickness of the material layer is between 200 and 400 angstroms;
   forming a patterned photoresist layer on the material layer, wherein the patterned photoresist layer with a line width less than 80 nm or the patterned photoresist layer is used to form a space with a gap width less than 80 nm, and a thickness of the patterned photoresist layer is 200 to 1200 angstroms;
   using the patterned photoresist layer as a mask, etching the material layer to form a plurality of etched first layers, wherein a first opening having a first width is formed between two opposite sidewalls of the two adjacent etched first layer;
   etching the mask layer to form a second opening by using the two opposite sidewalls of the adjacent etched first layer as an etching mask, wherein the second opening has a second width on the lower surface; and
   forming a third opening having the second width in the objective material layer to expose the upper surface of the substrate.

2. The method of claim 1, wherein the metal-containing substance is selected from the group consisting of Ti, TiN, Ta, TaN, W and WN.

3. The method of claim 1, wherein an etch selectivity of the mask layer to the material layer is greater than 3.

4. The method of claim 1, wherein an etch selectivity of the mask layer to the material layer is greater than 10.

5. The method of claim 1, wherein an etch selectivity of the mask layer to the material layer is greater than 15.

6. The method of claim 1, wherein the step of forming the material layer further comprises performing a trimming process to the patterned photoresist layer so as to reduce a line width before the step of etching the stop layer.

7. The method of claim 1, wherein a material of the metal layer comprises Cu, AlCu or AlSiCu.

8. The method of claim 1, wherein a material of the mask layer comprises $TEOS-SiO_2$, BPSG, PSG, HSQ, FSG, USG, SiN or SiON.

9. The method of claim 1, wherein a thickness of the mask layer is between about 1000 and 4000 angstroms.

10. A patterning method, comprising:
    providing a stacking structure on a substrate having an upper surface, wherein the stacking structure comprises an objective material layer, a dielectric material layer with a lower surface and a metal-containing substance layer sequentially formed on the substrate, wherein a thickness of the metal-containing substance layer is between 200 and 400 angstroms, and the objective material layer is a multi-layer structure comprising a barrier layer, a metal layer and an anti-reflection layer sequentially formed on the substrate;
    forming a patterned photoresist layer directly on the metal-containing substance layer, wherein the patterned photoresist layer with a line width less than 80 nm or the patterned photoresist layer is used to form a space with a gap width less than 80 nm, and a thickness of the patterned photoresist layer is 200 to 1200 angstroms;
    using the patterned photoresist layer as a mask, patterning the metal-containing substance layer to form a first opening having a first width between two opposite sidewalls of the two adjacent patterned metal-containing substance layer;
    etching the dielectric material layer by using the two opposite sidewalls of the adjacent patterned metal-containing substance layer as a mask to form a second opening, wherein the second opening has a second width on the lower surface; and
    forming a third opening having the second width in the objective material layer to expose the upper surface of the substrate.

11. The method of claim 10, wherein a material of the metal-containing substance layer is selected from the group consisting of Ti, TiN, Ta, TaN, W and WN.

12. The method of claim 10, wherein the step of patterning the metal-containing substance layer further comprises performing a trimming process to the patterned photoresist layer so as to reduce a line width before the step of etching the metal-containing substance layer.

13. The method of claim 10, wherein a material of the metal layer comprises Cu, AlCu or AlSiCu.

14. A patterning method, comprising:
providing a substrate with an upper surface, the substrate has an objective material layer thereon, wherein the objective material layer is a multi-layer structure comprising a barrier layer, a metal layer and an anti-reflection layer sequentially formed on the substrate;
forming a mask layer having a lower surface on the objective material layer;
forming a stop layer on the mask layer, wherein a thickness of the stop layer is between 200 and 400 angstroms;
forming a patterned photoresist layer on the stop layer, wherein the patterned photoresist layer with a line width less than 80 nm or the patterned photoresist layer is used to form a space with a gap width less than 80 nm, and a thickness of the patterned photoresist layer is 200 to 1200 angstroms;
etching the stop layer, using the patterned photoresist layer as the mask, to form a metal-containing patterned layer on the mask layer, the metal-containing patterned layer comprising a first opening having a first width between two opposite sidewalls of the first opening;
performing an etching recipe to pattern the mask layer to form a second opening in the mask layer using the two opposite sidewalls of the first opening as a mask, wherein an etch selectivity of the mask layer to the metal-containing patterned layer is greater than 3, wherein the second opening has a second width at the lower surface; and
patterning the conductive layer to expose the upper surface of the substrate, using the patterned mask layer as a mask.

15. The method of claim 14, wherein the step of forming the metal-containing patterned layer further comprises performing a trimming process to the patterned photoresist layer so as to reduce a line width before the step of etching the stop layer.

16. The method of claim 14, wherein a material of the mask layer comprises TEOS-$SiO_2$, BPSG, PSG, HSQ, FSG, USG, SiN or SiON.

* * * * *